(12) United States Patent
Tocchio et al.

(10) Patent No.: US 10,274,512 B2
(45) Date of Patent: Apr. 30, 2019

(54) MICROELECTROMECHANICAL SENSOR DEVICE WITH REDUCED STRESS SENSITIVITY

(71) Applicant: STMICROELECTRONICS S.R.L., Agrate Brianza (IT)

(72) Inventors: Alessandro Tocchio, Milan (IT); Francesco Rizzini, Cornaredo (IT); Luca Guerinoni, Premolo (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 146 days.

(21) Appl. No.: 15/182,317

(22) Filed: Jun. 14, 2016

(65) Prior Publication Data

US 2017/0108530 A1 Apr. 20, 2017

(30) Foreign Application Priority Data

Oct. 14, 2015 (IT) .................. 102015000061683

(51) Int. Cl.
*B81B 3/00* (2006.01)
*G01P 1/00* (2006.01)
(Continued)

(52) U.S. Cl.
CPC .......... *G01P 15/125* (2013.01); *B81B 3/0072* (2013.01); *G01C 19/5755* (2013.01); *G01P 1/00* (2013.01); *G01P 2015/0814* (2013.01)

(58) Field of Classification Search
CPC .. G01P 15/125; G01P 1/00; G01P 2015/0814; G01C 19/5755; B81B 3/0072
See application file for complete search history.

(56) References Cited

U.S. PATENT DOCUMENTS 6,450,031 B1   9/2002   Sakai et al.
7,121,141 B2   10/2006  McNeil
(Continued)

FOREIGN PATENT DOCUMENTS

CN    2338750 Y    9/1999
CN    101657728 A  2/2010
(Continued)

OTHER PUBLICATIONS

Liu et al., "Wafer-level Adhesive Bonding with Benzocyclobutene for the Accelerometer," Electronic Sci. & Tech., No. 25, Issue 9, 2012, pp. 9-12.
(Continued)

*Primary Examiner* — Lisa M Caputo
*Assistant Examiner* — Irving A Campbell
(74) *Attorney, Agent, or Firm* — Seed IP Law Group LLP

(57) ABSTRACT

A MEMS sensor device provided with a sensing structure, having: a substrate with a top surface extending in a horizontal plane; an inertial mass, suspended over the substrate; elastic coupling elements, elastically connected to the inertial mass so as to enable inertial movement thereof with respect to the substrate as a function of a quantity to be detected along a sensing axis belonging to the horizontal plane; and sensing electrodes, capacitively coupled to the inertial mass so as to form at least one sensing capacitor, a value of capacitance of which is indicative of the quantity to be detected. The sensing structure moreover has a suspension structure, to which the sensing electrodes are rigidly coupled, and to which the inertial mass is elastically coupled through the elastic coupling elements; the suspension structure is connected to an anchorage structure, fixed with respect to the substrate, by means of elastic suspension elements.

20 Claims, 5 Drawing Sheets

(51) Int. Cl.
*G01P 15/125* (2006.01)
*G01C 19/5755* (2012.01)
*G01P 15/08* (2006.01)

(56) References Cited

U.S. PATENT DOCUMENTS

| | | |
|---|---|---|
| 7,640,805 B2 | 1/2010 | Diamond et al. |
| 8,020,443 B2 | 9/2011 | Lin et al. |
| 8,198,715 B2 * | 6/2012 | Laming ............... B81B 3/0072 257/396 |
| 8,434,364 B2 | 5/2013 | Cazzaniga et al. |
| 8,610,222 B2 | 12/2013 | Lin et al. |
| 8,752,430 B2 | 6/2014 | Burghardt et al. |
| 2002/0170355 A1 | 11/2002 | Malametz |
| 2010/0175473 A1 | 7/2010 | Classen |
| 2011/0174074 A1 | 7/2011 | Li et al. |
| 2012/0262026 A1 * | 10/2012 | Lin ...................... B81B 3/0072 310/300 |
| 2013/0319117 A1 | 12/2013 | McNeil et al. |
| 2014/0374849 A1 | 12/2014 | Lin |
| 2016/0139172 A1 | 5/2016 | Scheurle et al. |
| 2016/0169931 A1 | 6/2016 | Tocchio |

FOREIGN PATENT DOCUMENTS

| | | |
|---|---|---|
| CN | 101981457 A | 2/2011 |
| CN | 102203001 A | 9/2011 |
| CN | 203825034 U | 9/2014 |
| EP | 2514712 A2 | 10/2012 |
| JP | 2001-41973 A | 2/2001 |

OTHER PUBLICATIONS

U.S. Appl. No. 14/858,563, filed Sep. 18, 2015, Z-Axis Microelectromechanical Detection Structure with Reduced Drifts.

* cited by examiner

MICROELECTROMECHANICAL SENSOR DEVICE WITH REDUCED STRESS SENSITIVITY

BACKGROUND

Technical Field

The present disclosure relates to a sensor device of a MEMS (Micro-Electro-Mechanical System) type, having a reduced sensitivity to stress, in particular to stress induced in a corresponding sensing structure via interaction with a corresponding package.

Description of the Related Art

The following description will make explicit reference, without this implying any loss of generality, to a MEMS accelerometer of a capacitive type.

MEMS accelerometers are known, with sensing axis in the horizontal plane, i.e., including microelectromechanical structures that sense accelerations acting along at least one direction parallel to a main plane of extension of the same structures and to the top surface of a corresponding substrate of semiconductor material (possibly also being able to detect further accelerations acting along a direction orthogonal to the same plane).

FIGS. 1a and 1b show by way of example a sensing structure of a known type, designated as a whole by 1, which belongs to a MEMS accelerometer with sensing axis in the plane.

The sensing structure 1 comprises: a substrate 2 made of semiconductor material, for example silicon, having a top surface 2a; and an inertial mass 3, which is made of conductive material, for example appropriately doped epitaxial silicon, and is arranged above the substrate 2, suspended at a certain distance from its top surface 2a.

The inertial mass 3 is also usually referred to as "a rotor mass" or simply "rotor", in so far as it is mobile as a result of the inertial effect, without, however, implying that the inertial mass 3 has a rotary movement. As described hereinafter, in this embodiment, the inertial mass 3 has, instead, a linear movement following upon sensing of an acceleration along the sensing axis.

The inertial mass 3 has a main extension in a horizontal plane xy, defined by a first horizontal axis x and by a second horizontal axis y orthogonal to one another, and substantially parallel to the top surface 2a of the substrate 2, and a substantially negligible dimension along an orthogonal axis z that is perpendicular to the aforesaid horizontal plane xy (and to the aforesaid top surface 2a of the substrate 2) and forms with the first and second horizontal axes x, y a set of three Cartesian axes xyz.

In particular, the first horizontal axis x coincides, in this case, with the sensing axis of the sensing structure 1.

The inertial mass 3 has a frame-like conformation, for example square or rectangular (or, in other words, it is shaped like a square or rectangular ring), in the aforesaid horizontal plane xy and has at the center a through opening, defining a window 4, which traverses it for an entire thickness.

The inertial mass 3 moreover has a plurality of holes 5, of very small size as compared to the aforesaid window 4, which traverse the mass 3 for its entire thickness, enabling, during the manufacturing process, its release (and its consequent suspended arrangement over the substrate 2) by chemical etching of an underlying sacrificial material, for example dielectric material (in a way not illustrated herein).

The sensing structure 1 further comprises a rotor anchorage structure 6 (so defined, since it is coupled, as will be described hereinafter, to the inertial mass, or rotor). The rotor anchorage structure 6 is set centrally within the window 4, parallel to the top surface 2a of the substrate 2, having a rectangular conformation in the horizontal plane xy and, in the example illustrated, a longitudinal extension along the first horizontal axis x.

The rotor anchorage structure 6 is fixedly coupled (anchored) to the substrate 2 by means of a rotor anchorage element 7, which extends like a pillar between the top surface 2a of the substrate 2 and the same anchorage structure 6. The rotor anchorage element 7 also has a rectangular conformation in the horizontal plane xy, with an extension smaller than that of the rotor anchorage structure 6, being located at a central portion of said rotor anchorage structure 6.

The inertial mass 3 is elastically coupled to the rotor anchorage structure 6 by means of elastic coupling elements 8, arranged within the window 4, between the inertial mass 3 and the rotor anchorage structure 6, on opposite sides of the rotor anchorage structure 6, along the direction of the first horizontal axis x.

In particular, the elastic coupling elements 8 are configured so as to enable movement of the inertial mass 3 along the first horizontal axis x with respect to the substrate 2, being compliant to deformations along the first horizontal axis x (and being substantially rigid with respect to deformations in different directions of the horizontal plane xy, or directions transverse to the same horizontal plane xy).

The inertial mass 3 moreover carries a number of mobile electrodes 9 (also referred to as "rotor electrodes"), fixedly coupled thereto (being integral, or made of a single piece, with the same inertial mass 3). The mobile electrodes 9 extend within the window 4 starting from the inertial mass 3. For example, the mobile electrodes 9 have a rectangular conformation in the horizontal plane xy and extend along the second horizontal axis y (in the example, two mobile electrodes 9 are present, extending on opposite sides with respect to the rotor anchorage structure 6, aligned along the second horizontal axis y). Like the inertial mass 3, the mobile electrodes 9 are suspended above the substrate 2, parallel to the top surface 2a of the same substrate 2.

The sensing structure 1 further comprises a number of first fixed electrodes 10a and second fixed electrodes 10b (also referred to as "stator electrodes"), which are set within the window 4, on opposite sides of a respective mobile electrode 9 in the direction of the first horizontal axis x, and face the respective mobile electrode 9 in the horizontal plane xy.

The first and second fixed electrodes 10a, 10b have in the example a rectangular conformation in the horizontal plane xy, with extension along the second horizontal axis y, in a direction parallel to the mobile electrodes 9.

The first and second fixed electrodes 10a, 10b are moreover rigidly coupled to the substrate 2 by means of respective stator anchorage elements 12a, 12b, which extend in the form of pillars between the top surface 2a of the substrate 2 and the same first and second fixed electrodes 10a, 10b. The stator anchorage elements 12a, 12b also have a rectangular conformation in the horizontal plane xy, with an extension smaller than that of the corresponding fixed electrodes 10a, 10b, being located at a central portion of the same fixed electrodes 10a, 10b.

The first fixed electrodes 10a and the second fixed electrodes 10b are biased (for example, through the corresponding stator anchorage element 12a, 12b) at a respective biasing voltage, different from the biasing voltage at which the mobile electrodes 9 are biased (for example, via a conductive path that includes the rotor anchorage element 7, the rotor anchorage structure 6, the elastic coupling elements 8, and the inertial mass 3, in this case all including electrically conductive material).

During operation, an acceleration component acting in the horizontal plane, in the example along the first horizontal axis x, determines displacement, by the inertial effect, of the inertial mass 3 from a resting position, along the same first horizontal axis x, and moving of the mobile electrodes 9 towards the first fixed electrodes 10a (or the second fixed electrodes 10b) and away from the second fixed electrodes 10b (or the first fixed electrodes 10a).

Consequently, a differential capacitive variation occurs between a first sensing capacitor $C_1$, with plane and parallel faces, formed between the mobile electrodes 9 and the first fixed electrodes 10a, and a second sensing capacitor $C_2$, also with plane and parallel faces, formed between the mobile electrodes 9 and the second fixed electrodes 10b. This capacitive variation is proportional to the value of the acceleration acting on the sensing structure 1.

The MEMS accelerometer further comprises an appropriate electronic reading circuit (so-called ASIC—Application-Specific Integrated Circuit), electrically coupled to the sensing structure 1, which receives at its input the aforesaid differential capacitive variation of the sensing capacitors $C_1$, $C_2$, and processes it so as to determine the value of acceleration, for generation of an electrical output signal (which is supplied to the outside of the MEMS accelerometer, for subsequent processing operations).

The aforesaid electronic reading circuit and the sensing structure 1 are typically provided in respective dies of semiconductor material, which are enclosed within a package, which protects the same dies, moreover providing an interface for electrical connection towards the outside. In so-called "substrate-level package" solutions, the package is obtained by means of one or more base and cap layers, which are directly coupled to the dies of the MEMS device, constituting the mechanical and electrical interface thereof towards the outside.

FIG. 2 is a schematic representation of a MEMS accelerometer 13, which includes a package 14 housing: a first die 15a, in which the ASIC electronic circuit is provided; a second die 15b, in which the sensing structure 1 is provided (including the substrate 2, above which the inertial mass 3, the mobile electrodes 9, and the first and second fixed electrodes 10a, 10b are provided), set stacked on the first die 15a; and a cap 15c, set on the stacked arrangement of the first and second dies 15a, 15b.

The package 14 further comprises: a base layer 16, which supports the aforesaid stacked arrangement of the first and second dies 15a, 15b and a cap 15c, and having an external surface 16a, which constitutes an external surface of the package 14 and carries electrical connection elements for connection to the outside, for example in the form of electrical connection pads 18; and a coating region 19, made for example of epoxy resin, which surrounds the aforesaid stacked arrangement of the first and second dies 15a, 15b and cap 15c, and defines lateral and top external surfaces of the package 14, designed to be in contact with the external environment.

The present applicant has realized that the sensing structure 1 previously described may be subject to significant measurement errors in the case where stress and deformations occur, for example as the temperature or environmental conditions vary, or on account of mechanical stresses.

In particular, the package of a microelectromechanical sensor undergoes deformations as the temperature varies, due to different coefficients of thermal expansion and to different values of Young's modulus of the different and variegated materials of which it is made, possibly causing corresponding deformations of the substrate 2 of the sensing structure 1 housed therein. Similar deformations may arise due to ageing of the materials, or to specific stress induced from outside, for example during soldering of the package on a printed-circuit board, or due to absorption of humidity by the materials of the same package.

As shown schematically in FIG. 3a, in the presence of deformations of the substrate 2, for example as a result of a thermal stress due to a positive temperature gradient ($\Delta T>0$), a swelling of the top surface 2a of the substrate 2 may for example occur (FIG. 3a markedly shows this deformation), which can entail moving of the fixed electrodes 10a, 10b away from the corresponding mobile electrode 9, with respect to an initial condition at rest, in the absence of external accelerations.

In particular, in FIG. 3b the distance at rest and in the absence of deformations is designated by $g_0$, and the displacements with respect to the condition at rest due to the deformation of the substrate 2 (which are variable as a function of the temperature, or in general of all those effects that are able to induce deformations in the substrate 2) are designated by $x_{1,\Delta T}$ and $x_{2,\Delta T}$.

These displacements entail the following variations of the values of the sensing capacitances $C_1$, $C_2$, which are undesired, in so far as they are not associated to the acceleration to be detected:

$$C_{1,\Delta T} = \frac{\varepsilon_0 \cdot A}{g_0 + x_{1,\Delta T}};$$

and $$C_{2,\Delta T} = \frac{\varepsilon_0 \cdot A}{g_0 + x_{2,\Delta T}}$$

Likewise, with reference to FIGS. 4a and 4b, a negative temperature gradient ($\Delta T<0$) entails, on account of a depression of the top surface 2a of the substrate 2, the following undesired variations of the values of the sensing capacitances $C_1$, $C_2$, on account, this time, of an approach of the fixed electrodes 10a, 10b to the corresponding mobile electrode 9, with respect to the initial condition at rest:

$$C_{1,\Delta T} = \frac{\varepsilon_0 \cdot A}{g_0 - x_{1,\Delta T}};$$

and $$C_{2,\Delta T} = \frac{\varepsilon_0 \cdot A}{g_0 - x_{2,\Delta T}}$$

These capacitive variations hence cause an undesired modification (the so-called "drift" or "offset") of the output signal at rest supplied by the MEMS accelerometer, referred to as "zero-g level", and a consequent error in acceleration detection.

In order to overcome the above drawback, a wide range of solutions have been proposed, which are not, however, altogether satisfactory.

Some solutions envisage optimization of the acceleration-sensing structure.

For example, US 2011/0023604 discloses a sensing structure, wherein positioning of the rotor and stator anchorages is optimized in order to reduce the drifts of the electrical parameters due to deformations of the substrate.

However, this solution, although advantageous, relates to a z-axis accelerometer, of a vertical type, i.e., designed for sensing accelerations orthogonal to the horizontal plane of main extension of the corresponding rotor mass.

Other solutions envisage optimization of the corresponding package. For example, use of a ceramic substrate, having a reduced sensitivity to deformations, has been proposed for this purpose.

However, this solution entails greater issues in the manufacturing process and in general higher costs. Moreover, the size of ceramic packages is generally greater than that of traditional packages made of plastic material.

BRIEF SUMMARY

One or more embodiments are directed to a microelectromechanical sensor device having reduced drifts of its electrical characteristics in response to temperature variations or to mechanical or environmental stress of various nature.

One embodiment is directed to a MEMS sensor device comprising a microelectromechanical sensing structure. The MEMS sensor device includes a substrate having a top surface extending in a horizontal plane. An inertial mass is suspended over the substrate. Elastic coupling elements elastically are coupled to the inertial mass and enable inertial movement of the inertial mass with respect to the substrate as a function of a quantity to be detected along a sensing axis in the horizontal plane. The MEMS sensor device includes sensing electrodes capacitively coupled to the inertial mass and forming at least one sensing capacitor. A suspension structure is also provided. The sensing electrodes are rigidly coupled to the suspension structure and the inertial mass is elastically coupled to the suspension structure by the elastic coupling elements. The MEMS sensor device further includes elastic suspension elements coupled to the suspension structure and an anchorage structure fixed with respect to said substrate. The suspension structure is coupled to the anchorage structure by the elastic suspension elements.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein.

DETAILED DESCRIPTION

As will be described in detail in what follows, according to one aspect of the present solution the sensing structure of the MEMS sensor device is configured so that the mobile electrodes and the fixed electrodes (which define the sensing capacitors) are mechanically coupled to the substrate by means of one and the same suspension structure; accordingly, deformations induced by the package in the substrate affect in a corresponding manner the mobile and fixed electrodes, rendering the sensing structure substantially insensitive to these deformations and preventing or reducing considerably modifications of the output signal at rest supplied by the MEMS sensor device (the so-called "zero-g level drift").

Figure 5:
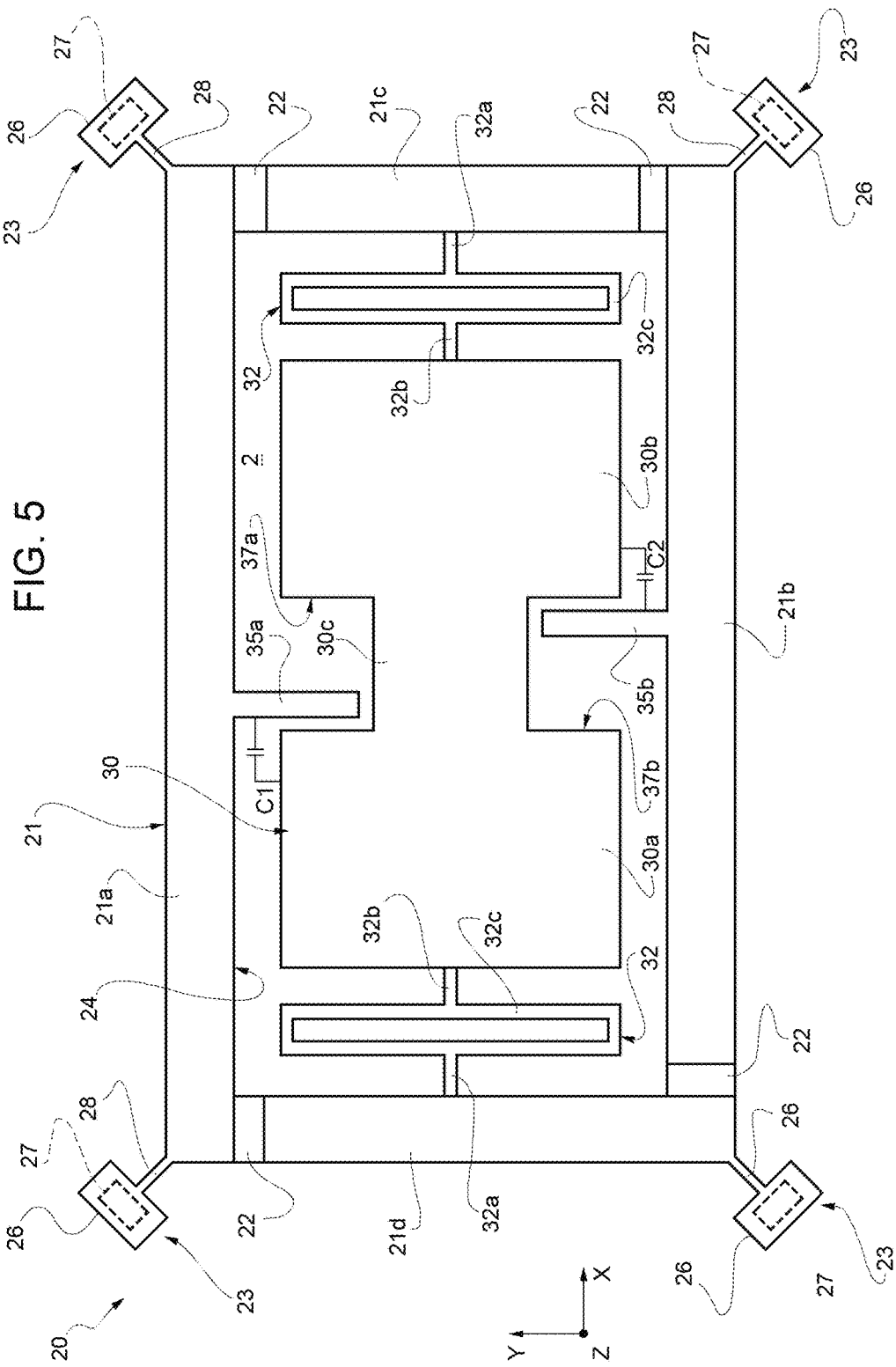
FIG. 5 is a schematic top plan view of a sensing structure of a MEMS sensor device, in accordance with a first embodiment of the present solution.

As shown in FIG. 5, a sensing structure according to one aspect of the present solution, designated as a whole by 20, comprises a suspension structure 21, configured to provide suspension with respect to the substrate, here designated once again by 2, both of the stator (the fixed structure, including the fixed electrodes) and of the rotor (the mobile structure, including the inertial mass and the associated mobile electrodes) of the same sensing structure 20.

In particular, the suspension structure 21 is configured to couple the stator and the rotor of the sensing structure 20 to an anchorage structure 23 for anchorage to the substrate 2, in this case being in common and shared by the stator and the rotor of the same sensing structure 20.

The suspension structure 21 has a frame-like conformation, with the shape of a rectangular ring in the horizontal plane xy, with a first pair of facing frame portions, 21a, 21b (in what follows, first and second frame portions 21a, 21b), which in the example have an extension along the first horizontal axis x, and a second pair of facing frame portions, 21c, 21d (in what follows, third and fourth frame portions 21c, 21d), which in the example have an extension (smaller than that of the frame portions of the first pair) along the second horizontal axis y.

In particular, the suspension structure 21 internally includes electrical-insulation regions 22, which electrically insulate the frame portions of one pair from the frame portions of the other pair.

Four electrical-insulation regions 22 are hence provided: two electrical-insulation regions 22, for separating the first frame portion 21a from the third and fourth frame portions 21c, 21d; and two further electrical-insulation regions 22 for separating the second frame portion 21b from the third and fourth frame portions 21c, 21d.

The electrical-insulation regions 22 are formed, for example, by dielectric-material regions set between the frame portions 21a-21d, or define reverse-biased PN junctions with the same frame portions 21a-21d, in any case being configured to provide an electrical insulation between the corresponding frame portions 21a-21d.

As will be highlighted also hereinafter, the electrical-insulation regions 22 thus make it possible to separate the stator of the sensing structure 20 from the rotor of the same sensing structure 20 in the electrical domain, and to cause the same stator and rotor to constitute a single mobile element in the mechanical domain (as regards response to package deformations).

The suspension structure 21 defines inside it an opening or a window 24, having a rectangular shape in the horizontal plane xy and traversing it for the entire thickness in the vertical direction z.

The anchorage structure 23 comprises anchorage portions 26, arranged above the top surface 2a of the substrate 2, outside the suspension structure 21, and mechanically coupled in a rigid manner to the same substrate 2 by means of anchorage elements 27, which extend in pillar fashion between the top surface 2a of the substrate 2 and the same anchorage portions 26.

The anchorage elements 27 are arranged centrally to the anchorage portions 26, having in the example a rectangular shape in the horizontal plane xy.

The suspension structure 21 is elastically connected to the anchorage structure 23 by means of elastic suspension elements 28, which extend, in the example linearly, between the same suspension structure 21 and the anchorage portions 26.

Possible displacements caused by the deformations of the package are transferred in a corresponding manner both to the stator and to the rotor of the sensing structure 20, through the suspension structure 21 and the elastic suspension elements 28. In this way, the rotor and the stator, in response to the possible deformations, move by a same amount and in a same direction, thereby making the sensing output insensitive to the same deformations.

In the embodiment illustrated in FIG. 5, the anchorage structure 23 comprises four anchorage portions 26, which are arranged at the vertices of the suspension structure 21 in the horizontal plane xy. The elastic suspension elements 28, which are also four in number, extend starting from the aforesaid vertices of the suspension structure 21, each towards the respective anchorage portion 26, with an inclination of approximately 45° with respect to the first horizontal axis x or second horizontal axis y, aligned in pairs in the direction of the diagonals of the suspension structure 21.

In the embodiment illustrated, the anchorage portions 26 have a rectangular shape in the horizontal plane xy, with sides inclined by approximately 45° with respect to the first and second horizontal axes xy, and major sides substantially orthogonal to the elastic suspension elements 28, which extend between the same major sides and the vertices of the suspension structure 21.

The sensing structure 20 further comprises an inertial mass (rotor mass) 30, which is arranged within the window 24 defined by the suspension structure 21 and is elastically connected to the same suspension structure 21 by elastic coupling elements 32.

The inertial mass 30 has a substantially rectangular shape in the horizontal plane xy, with the two major sides along the first horizontal axis x and the two minor sides along the second horizontal axis y (in the embodiment illustrated).

In this embodiment, two elastic coupling elements 32 are present, which extend starting from the minor sides of the inertial mass 30 up to a respective one of the third and fourth facing frame portions, 21c, 21d of the suspension structure 21.

Each elastic coupling element 32 comprises: a first connecting portion 32a, having a rectilinear extension and a first end connected to a respective one between the third and fourth facing frame portions, 21c, 21d; a second connecting portion 32b, having rectilinear extension and a respective first end connected to a respective minor side of the inertial mass 30; and a deformation portion 32c, which is connected between the second ends of the first and second connecting portions 32a, 32b, and has the shape of a rectangular ring with major extension along the second horizontal axis y.

In use, the elastic coupling elements 32 enable inertial movement of the inertial mass 30 along the first horizontal axis x, in response to a detected acceleration acting along the same first horizontal axis x. In particular, the major sides of the deformation portions 32c of the elastic coupling elements 32 are configured to bend to enable the aforesaid inertial movement of the inertial mass 30.

The elastic suspension elements 28 do not enable any movement, by the inertial effect, of the suspension structure 21, which remains substantially still and unperturbed. The elastic suspension elements 28 are in fact rigid to movements along the sensing axis (in the example, the first horizontal axis x).

Consequently, the aforesaid inertial movement of the inertial mass 30 is a relative movement with respect to the suspension structure 21.

The sensing structure 20 further comprises first and second fixed electrodes (stator electrodes) 35a, 35b set within the window 24, fixedly coupled to the suspension structure 21, in particular to the first and second facing frame portions 21a, 21b, respectively, of the same suspension structure 21 (hence also these are still with respect to the inertial movement of the inertial mass 30).

The first and second fixed electrodes 35a, 35b are capacitively coupled to the inertial mass 30 so as to form a first sensing capacitor $C_1$ and a second sensing capacitor $C_2$, having a differential capacitance variation upon displacement of the inertial mass 30 along the first horizontal axis x. In particular, the first and second fixed electrodes 35a, 35b are electrically biased at a respective first and second potential, through a conductive path that includes the respective first frame portion 21a or second frame portion 21b, and the anchorage portions 26 and the anchorage elements 27 connected to the first or second facing frame portions 21a, 21b.

The first and second fixed electrodes 35a, 35b have a rectangular shape in the horizontal plane xy, with an extension along the second horizontal axis y, a first end connected to the suspension structure 21 and a second end set within the window 24.

In particular, in the embodiment illustrated in FIG. 5, the inertial mass 30 has two recesses 37a, 37b, located centrally with respect to the inertial mass 30 and aligned along the second horizontal axis y. The recesses 37a, 37b divide the inertial mass 30 into a first portion 30a and a second portion 30b, connected by a central connecting portion 30c.

The first and second fixed electrodes 35a, 35b extend within these recesses 37a, 37b, so as to be in the proximity of, and facing, a respective one between the first portion 30a and the second portion 30b of the inertial mass 30, with which they form a respective one between the first and second sensing capacitors $C_1$, $C_2$. The above first and second portions 30a, 30b of the inertial mass 30 themselves constitute, in this case, the mobile electrodes of the sensing structure 20.

These mobile electrodes are electrically biased at a common potential, through a conductive path, which includes, in the example, the fourth frame portion 21d, and the anchorage portion 26 and the anchorage element 27 connected to the same fourth facing frame portion 21d.

During operation, in response to an acceleration component acting along the sensing axis (in the example the first horizontal axis x), the inertial mass 30 moves by the inertial effect, along the sensing axis, due to the deformation of the elastic coupling elements 32.

As a result of this movement, the first fixed electrodes 35a move towards/away-from the inertial mass 30 (in particular, the corresponding first portion 30a) and correspondingly the second fixed electrodes 35b move away-from/towards the inertial mass 30 (in particular, the corresponding second portion 30b). A differential capacitive variation hence occurs of the first and second sensing capacitors $C_1$, $C_2$, which is processed (in a known way, not described in detail herein) by the ASIC associated to the sensing structure in the MEMS sensor device, for generation of an electrical output signal.

Figure 6:
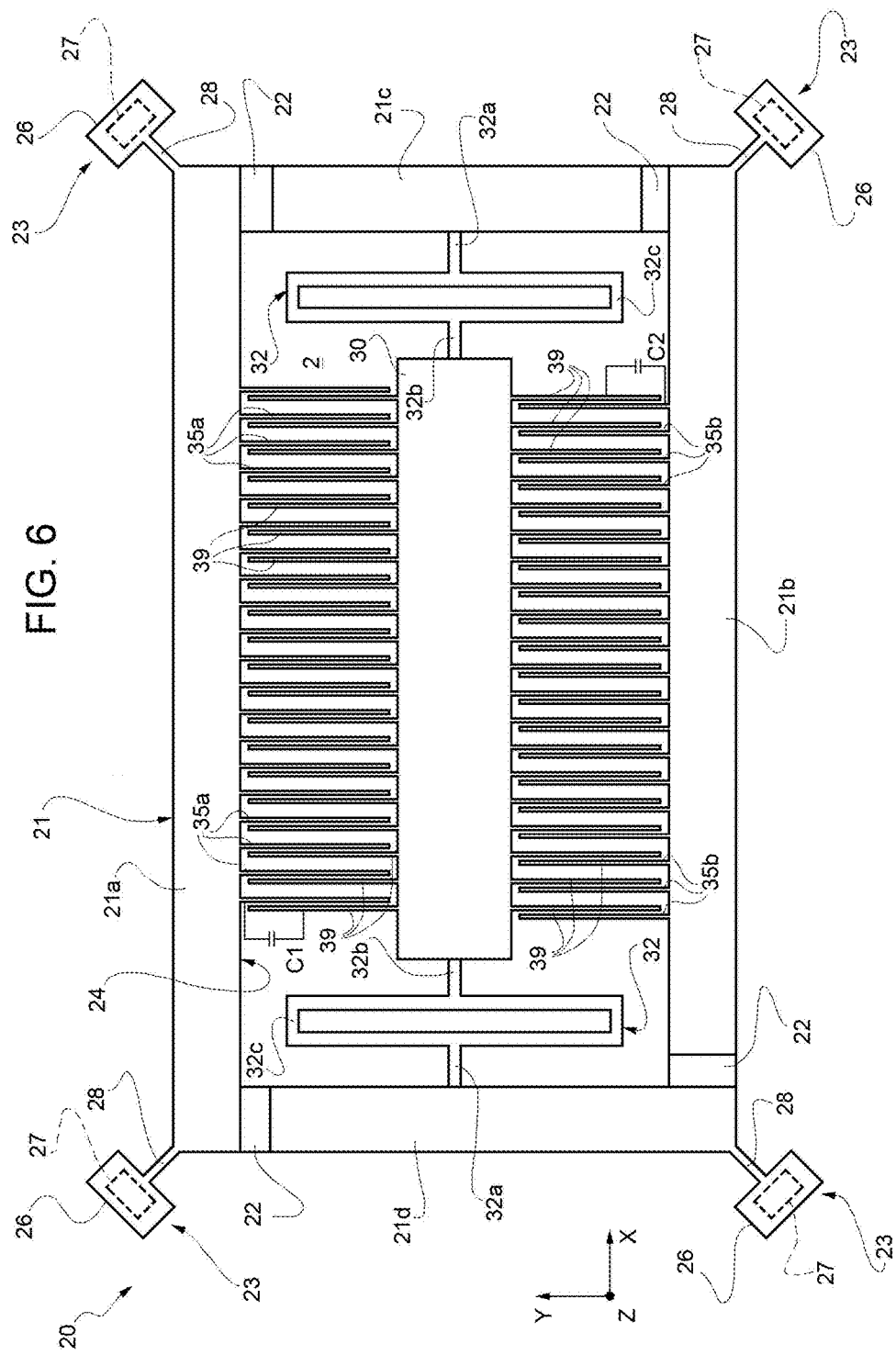
FIG. 6 is a schematic top plan view of a sensing structure of a MEMS sensor device, in accordance with a second embodiment of the present solution.

With reference to FIG. 6, a further embodiment of the sensing structure 20 may envisage a different arrangement of the mobile and fixed electrodes that are designed to form the first and second sensing capacitors $C_1$, $C_2$.

In this case, the inertial mass 30 has a full rectangular shape in the horizontal plane xy, without recesses, and carries integrally and fixedly a plurality of mobile electrodes 39, which are suspended above the substrate 2.

In particular, the mobile electrodes 39 have a rectangular conformation in the horizontal plane xy and extend, in the example, along the second horizontal axis y (in a direction orthogonal to the sensing axis), aligned on opposite sides of the inertial mass 30 along the second horizontal axis y.

The first fixed electrodes 35a and the second fixed electrodes 35b are in this case equal in number to, and comb-fingered with, the mobile electrodes 39 inside the window 24, being set facing and parallel to the same mobile electrodes 39. In particular, the first fixed electrodes 35a are set on the opposite side of the mobile electrodes 39 with respect to the second fixed electrodes 35b, in the direction of the first horizontal axis x, in such a way that when the mobile electrodes 39 move towards/away-from the first fixed electrodes 35a, correspondingly the same mobile electrodes 39 move away-from/towards the second fixed electrodes 35b.

Figure 7:
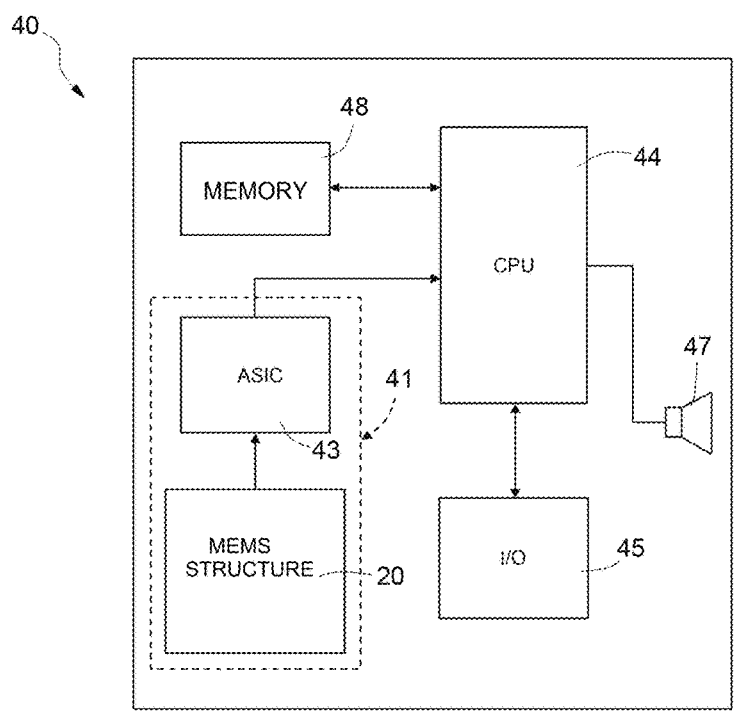
FIG. 7 is an overall block diagram of an electronic apparatus incorporating a MEMS sensor device according to a further aspect of the present solution.

FIG. 7 moreover shows an electronic apparatus 40, in which it is possible to use the sensing structure 20 and the corresponding acceleration-sensor device with axis in the horizontal plane xy, here designated by 41.

Figure 1A:
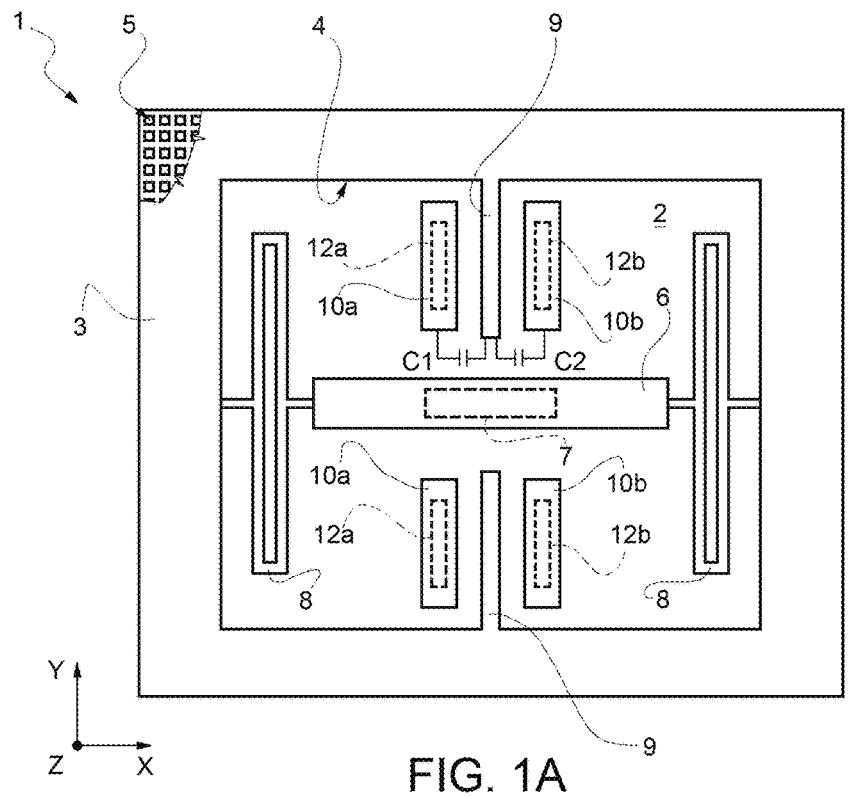
FIG. 1a is a schematic top plan view of a sensing structure of a MEMS sensor device of a known type.
Figure 1B:
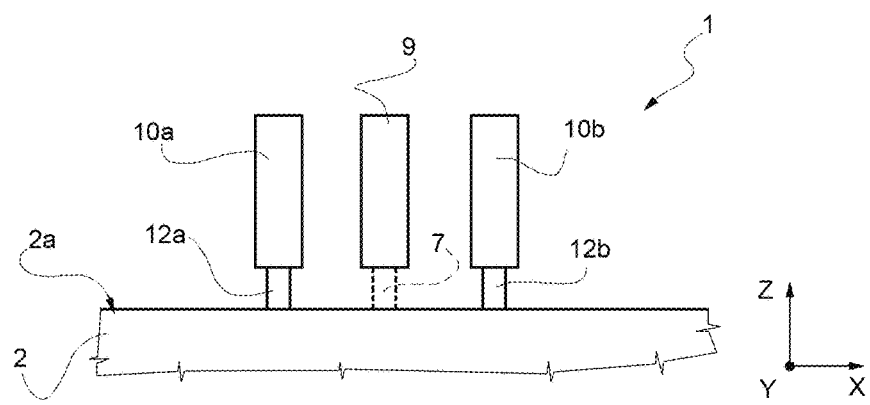
FIG. 1b is a cross-sectional view of the sensing structure of FIG. 1a in condition at rest.
Figure 2:
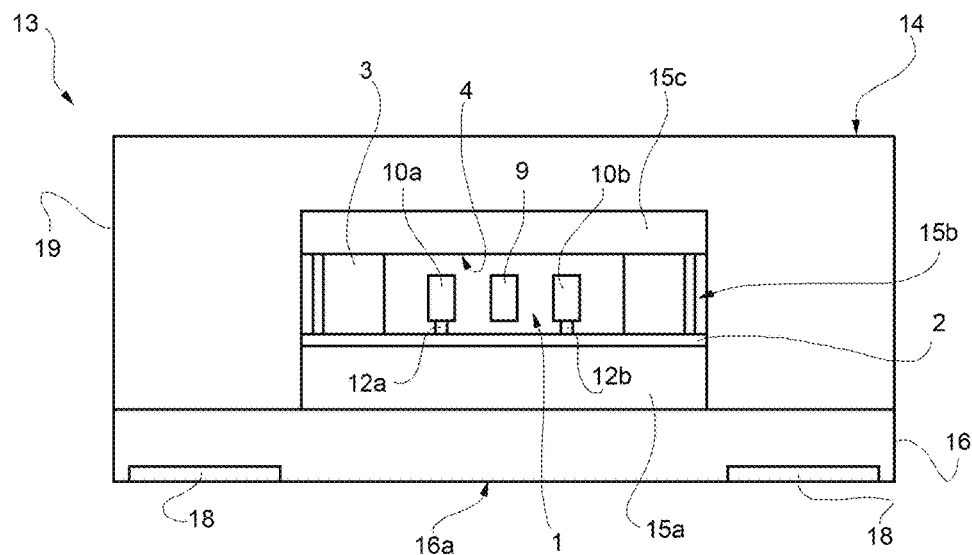
FIG. 2 is a schematic cross-sectional view of the MEMS sensor device and of a corresponding package.
Figure 3A:
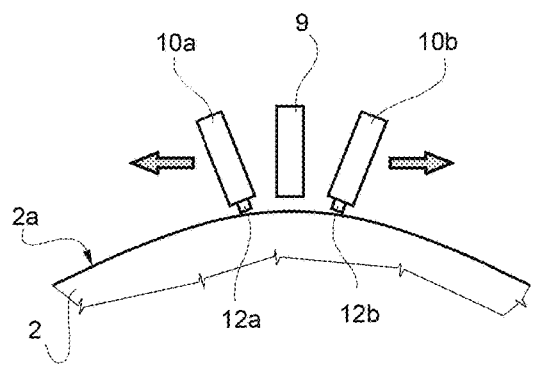
FIGS. 3a-3b are schematic diagrams of the sensing structure of the MEMS sensor device in the presence of a first deformation of a corresponding substrate.
Figure 3B:
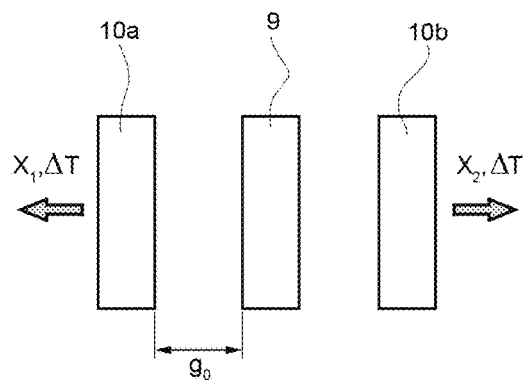
Figure 4A:
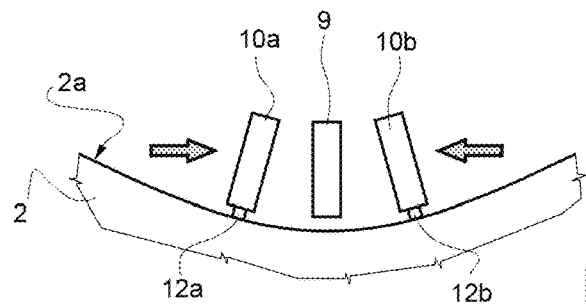
FIGS. 4a-4b are schematic diagrams of the sensing structure of the MEMS sensor device in the presence of a second deformation of a corresponding substrate.
Figure 4B:
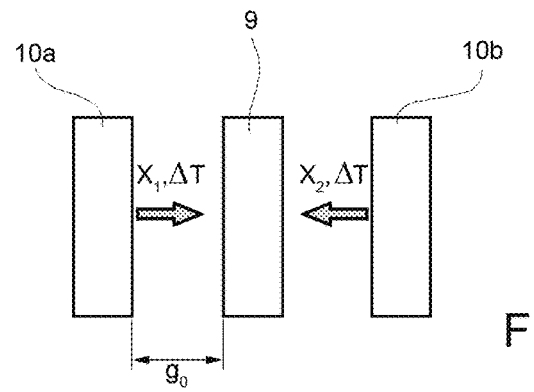

The MEMS sensor device 41 includes, in addition to the aforesaid sensing structure 20, an ASIC 43 that provides the corresponding reading interface (and that can be made in the same die as the sensing structure 20, or in a different die, which may in any case be housed in the same package as discussed previously with reference to FIG. 2).

The electronic apparatus 40 is preferably a portable apparatus for mobile communications, such as for example a mobile phone, a PDA (Personal Digital Assistant), a portable computer, a wearable device, such as a smartwatch, but also a digital audio player with voice-recording capacity, a photographic camera or video camera, a controller for videogames, etc. The electronic apparatus 40 is generally able to process, store and/or transmit and receive signals and information.

The electronic apparatus 40 comprises a microprocessor 44, which receives the acceleration signals detected by the MEMS sensor device 41, and an input/output interface 45, for example provided with a keyboard and a display, connected to the microprocessor 44. Moreover, the electronic apparatus 40 may comprise a speaker 47, for generating sounds on an audio output (not shown), and an internal memory 48.

The advantages of the MEMS sensor device according to the present solution are clear from the foregoing description.

In any case, it is again emphasized that the present solution enables minimization of the drifts in the electrical performance of the sensing structure 20, due to deformations of the substrate 2, on account, for example, of temperature variations or mechanical stress, for instance deriving from soldering to a printed-circuit board or due to causes of other nature (such as ageing or moisture absorption).

The sensing structure 20 is in this way extremely stable, irrespective of the operating conditions and the assembly in the corresponding package.

The general sensing performance, in terms for example of sensitivity, do not moreover vary as compared to traditional solutions, given that the sensing mechanism is not modified, and likewise the conformation and arrangement of the sensing electrodes with respect to the inertial mass 30 are not substantially modified.

The solution described does not even envisage substantial modifications to the manufacturing process normally employed, envisaging substantially the same steps of growth and selective etching of layers of material on the substrate 2.

Finally, it is clear that modifications and variations may be made to what has been described and illustrated herein, without thereby departing from the scope of the present disclosure.

In particular, it is evident that the sensing structure 20 can be arranged in the horizontal plane in order to detect a component of acceleration directed along the second horizontal axis y, in a way altogether similar to what has been discussed previously.

Some aspects of the sensing structure 20 could moreover vary, without this entailing substantial modifications to the proposed solution. For example, it is evident that the number of anchorage portions 26 connected to the suspension structure 21, as well as their arrangement with respect to the suspension structure 21, may vary with respect to what is illustrated purely by way of example.

The number of sensing electrodes (fixed electrodes 35a, 35b and mobile electrodes 40) may vary with respect to the one illustrated; for example, a larger number of electrodes may be present, or else even just one pair of electrodes, in the case where a differential sensing scheme is not adopted.

It is moreover clear that the solution described may be advantageously applied also to different types of MEMS sensor devices, in which sensing of a capacitive variation is desired, for example in gyroscope sensors.

Finally, it is evident that the solution described applies in an equivalent way to uniaxial sensors or to biaxial sensors or triaxial sensors able to detect accelerations (or different quantities) also along the second horizontal axis y and/or along the vertical axis z (these sensors being provided for this purpose with further structures and mobile and fixed electrodes, arranged in a known manner).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS sensor device comprising:
a substrate having a top surface extending in a horizontal plane;
an inertial mass suspended over the substrate;
elastic coupling elements elastically coupled to the inertial mass and enabling inertial movement of the inertial mass with respect to the substrate as a function of a quantity to be detected along a sensing axis in the horizontal plane;

sensing electrodes capacitively coupled to the inertial mass and forming at least one sensing capacitor;

a suspension structure, the sensing electrodes rigidly coupled to first portions of the suspension structure, the inertial mass being elastically coupled to second portions of the suspension structure by the elastic coupling elements, the suspension structure including electrical-insulation regions that electrically insulate the first portions of the suspension structure from the second portions of the suspension structure, the electrical-insulation regions forming reverse-biased PN junctions with the first portions of the suspension structure and the second portions of the suspension structure adjacent to the electrical-insulation regions;

elastic suspension elements coupled to the suspension structure; and an anchorage structure fixed with respect to said substrate, the suspension structure being coupled to the anchorage structure by the elastic suspension elements.

2. The device according to claim 1, wherein the suspension structure frames the inertial mass and defines a window, the sensing electrodes and the inertial mass being arranged in the window of the suspension structure.

3. The device according to claim 1, wherein the elastic suspension elements are configured to elastically couple the suspension structure to the substrate.

4. The device according to claim 1, wherein the elastic suspension elements are configured to transmit deformations of the substrate in a corresponding manner to the inertial mass and to the sensing electrodes.

5. The device according to claim 1, wherein the anchorage structure comprises a plurality of anchorage portions, each of the plurality of anchorage portions being fixed with respect to the substrate, arranged externally to the suspension structure, and coupled to the suspension structure by respective ones of the elastic suspension elements, wherein the elastic suspension elements have a rectilinear conformation.

6. The device according to claim 5, wherein the plurality of anchorage portions are arranged at vertices of the suspension structure, and the elastic suspension elements extend starting from the vertices towards a respective anchorage portion, and aligned in pairs with opposite inclination with respect to the sensing axis.

7. The device according to claim 1, wherein the first portions and the second portions of the suspension structure are set, during operation, at biasing voltages that are different from each other, and wherein the inertial mass is electrically biased through the elastic coupling elements.

8. The device according to claim 1, wherein the inertial mass includes mobile electrodes capacitively coupled to said sensing electrodes and forms the at least one sensing capacitor; and wherein the mobile electrodes and the sensing electrodes are arranged in a comb-fingered configuration.

9. The device according to claim 1, wherein the elastic coupling elements are compliant to bending along said sensing axis enabling the inertial movement of the inertial mass.

10. The device according to claim 9, wherein the elastic coupling elements each comprise:

a first connecting portion having a rectilinear extension and a first end coupled to the suspension structure;

a second connecting portion having a rectilinear extension and a respective first end coupled to said inertial mass; and a deformation portion that is coupled between the first and second connecting portions and has the shape of a rectangular ring having a longitudinal axis that is transverse to the rectilinear extensions of the first and second connecting portions.

11. The device according to claim 1, wherein the elastic suspension elements are rigid to movements along the sensing axis.

12. The device according to claim 1, further comprising an electronic reading circuit electrically coupled to the MEMS sensor device, the electronic reading circuit being configured to process a variation of capacitance of the at least one sensing capacitor as a function of the quantity to be detected.

13. The device according to claim 12, wherein the MEMS sensor device and the electronic reading circuit form an accelerometer configured to detect acceleration along the sensing axis.

14. A method for manufacturing a MEMS sensor device, the method comprising:

forming an inertial mass suspended over a surface of a substrate;

forming elastic coupling elements, wherein the elastic coupling elements elastically are coupled to the inertial mass so as to enable inertial movement of the inertial mass with respect to the substrate;

forming first sensing electrodes coupled to the inertial mass; forming a suspension structure and second sensing electrodes that are rigidly coupled to first portions of the suspension structure so as to form at least one sensing capacitor wherein the inertial mass is elastically coupled to second portions of the suspension structure by the elastic coupling elements, wherein the suspension structure is coupled to an anchorage structure fixed with respect to the substrate by elastic suspension elements; and forming electrical-insulation regions in the suspension structure, the electrical-insulation regions electrically insulating the first portions of the suspension structure from the second portions of the suspension structure, the electrical-insulation regions forming reverse-biased PN junctions with the first portions of the suspension structure and the second portions of the suspension structure adjacent to the electrical-insulation regions.

15. The method according to claim 14, wherein the inertial movement of the inertial mass is a function of a quantity to be detected along a sensing axis belonging to a horizontal plane of the surface of the substrate.

16. The method according to claim 15, wherein the elastic suspension elements are rigid to movements along the sensing axis.

17. An electronic device comprising:

a microprocessor; and a MEMS sensor coupled to the microprocessor, the MEMS sensor including:

a substrate having a first surface;

a plurality of anchors coupled to the first surface of the substrate;

a plurality of elastic suspension elements coupled to the plurality of anchors, respectively;

a suspension structure suspended relative to the first surface of the substrate by the plurality of elastic suspension elements, the suspension structure being substantially rigid in a first direction and having a central axis, the suspension structure including first, second, third, and fourth electrical-insulation regions that electrically insulate first portions of the suspension structure from second portions of the suspension structure, the first and second electrical-insulation regions being on a first side of the central axis, the third and fourth electrical-insulation regions being on a second side of the central axis, at least one of the first or the second electrical-insulation regions being asymmetrically arranged with respect to the third and fourth electrical-insulation regions relative to the central axis;

an inertial mass suspended relative to the first surface of the substrate;

elastic coupling elements elastically coupled to the inertial mass and to the first portions of the suspension structure, the elastic coupling elements enabling movement of the inertial mass with respect to the substrate in the first direction; and sensing electrodes coupled to the second portions of the suspension structure, the sensing electrodes being capacitively coupled to the inertial mass and forming sensing capacitors, respectively.

18. The electronic device according to claim 17, wherein the inertial mass is located in an opening of the suspension structure.

19. The electronic device according to claim 17, wherein the electronic device is at least one of a mobile phone, a PDA (Personal Digital Assistant), a portable computer, a wearable device, a digital audio player, a photographic camera, a video camera, and a controller for videogames.

20. The electronic device according to claim 17, wherein the suspension structure has a shape having a plurality of corners, the plurality of anchors are arranged at a respective one of the plurality of corners of the suspension structure.

\* \* \* \* \*